United States Patent
Weissman et al.

(10) Patent No.: US 7,047,472 B2
(45) Date of Patent: May 16, 2006

(54) METHOD FOR CORRECTING NOISE ERRORS IN A DIGITAL SIGNAL

(75) Inventors: Itschak Weissman, Menlo Park, CA (US); Erik Ordentlich, San Jose, CA (US); Gadiel Seroussi, Cupertino, CA (US); Marcelo Weinberger, San Jose, CA (US); Sergio Verdu, Princeton, NJ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 439 days.

(21) Appl. No.: 10/688,520

(22) Filed: Oct. 17, 2003

(65) Prior Publication Data

US 2005/0097421 A1    May 5, 2005

(51) Int. Cl.
 *G06F 11/00*    (2006.01)
 *G06F 11/30*    (2006.01)
 *G08C 25/00*    (2006.01)
 *H03M 13/00*    (2006.01)
 *H04L 1/00*    (2006.01)

(52) U.S. Cl. .................................... 714/746; 714/800

(58) Field of Classification Search ............... 714/746, 714/800
See application file for complete search history.

(56) References Cited

U.S. PATENT DOCUMENTS

| | | | | |
|---|---|---|---|---|
| 5,533,033 A | * | 7/1996 | Ratner | 714/746 |
| 5,596,565 A | * | 1/1997 | Yonemitsu et al. | 369/275.3 |
| 6,161,209 A | * | 12/2000 | Moher | 714/780 |
| 6,199,186 B1 | * | 3/2001 | Chen et al. | 714/755 |

* cited by examiner

Primary Examiner—Guy J. Lamarre

(57) ABSTRACT

An apparatus and method for processing a received signal that has been corrupted by a channel to generate a processed signal having less signal corruption than the received signal is disclosed. The apparatus stores the received signal, information specifying the probability that a symbol having a value I will be converted to a symbol having a value J by the channel, and information specifying a signal degradation function that measures the signal degradation that occurs if a symbol having the value I is replaced by symbol having a value J. The controller replaces each symbol having a value I in a context of that symbol in the received signal with a symbol having a value J that minimizes the overall signal degradation in the processed signal relative to the underlying noise-free signal as estimated via the observed statistics within that context.

17 Claims, 2 Drawing Sheets

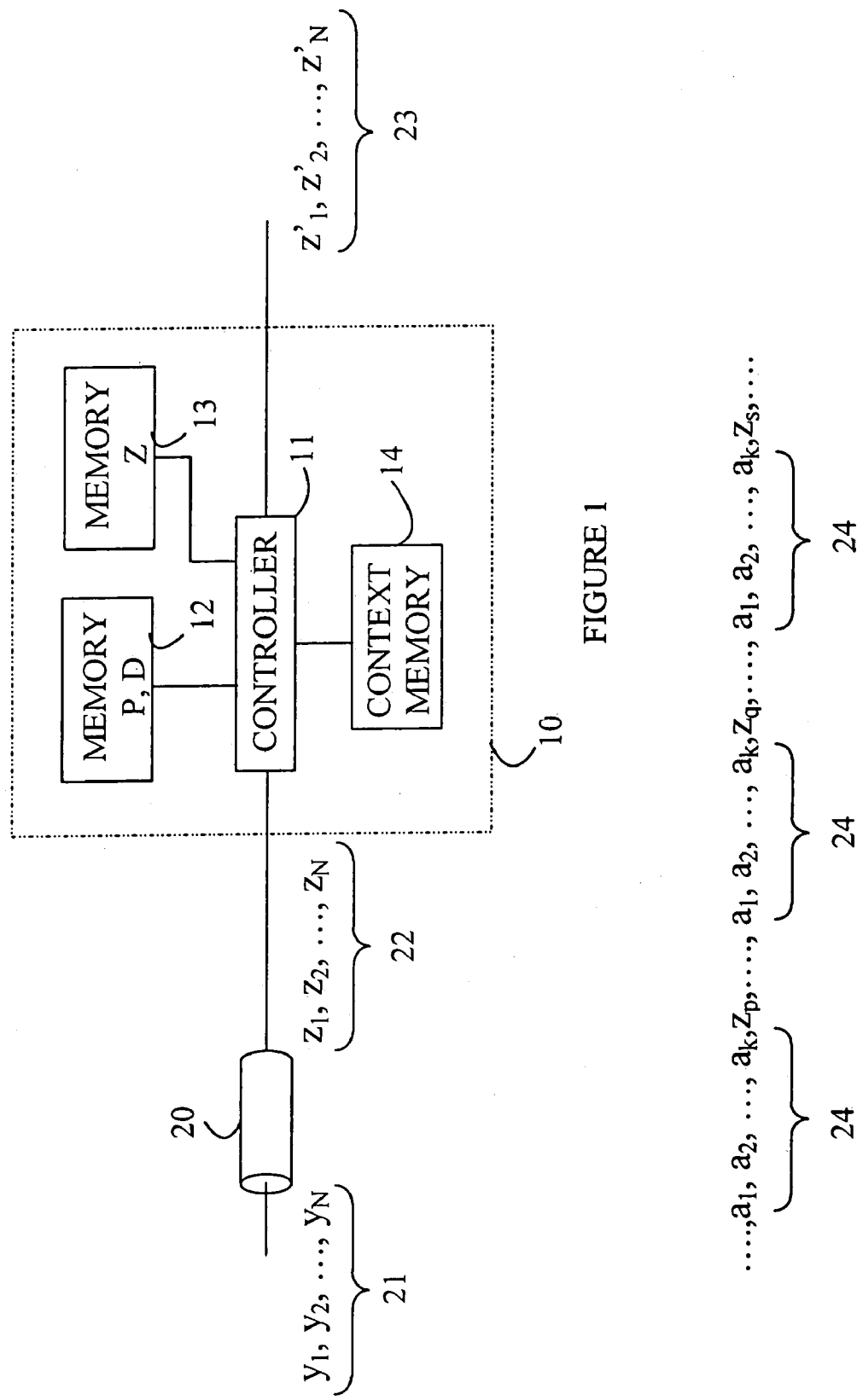

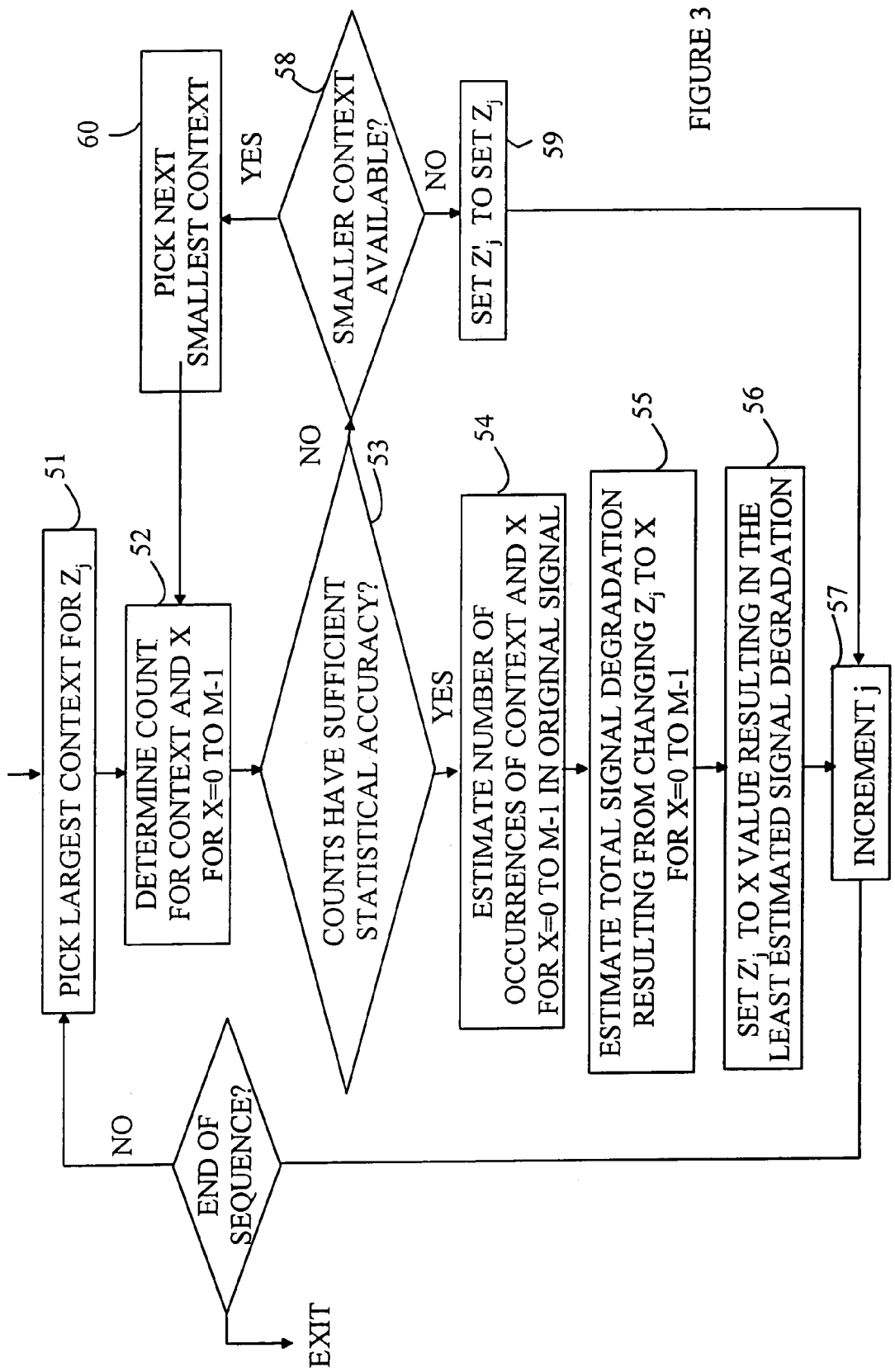

1

METHOD FOR CORRECTING NOISE ERRORS IN A DIGITAL SIGNAL

FIELD OF THE INVENTION

The present invention relates to signal processing, and more particularly, to the correction of errors introduced into a signal by the transmission or processing of that signal.

BACKGROUND OF THE INVENTION

The present invention can be more easily understood in terms of a simple exemplary system. Consider a telephone conversation in which a person talks into a microphone whose output is digitized and then transmitted to a second person via various telephone lines and switch systems. The speaker at the second person's location receives a sequence of digital values that are then played back to the second person. In general, the received sequence will differ from the transmitted sequence because of errors introduced by the transmission system, digital-to-analog converters, and analog to digital converters. For example, noise in the transmission system results in some of the digital values in the transmitted sequence being altered. One goal of a denoising system is to remove as many of these noise errors as possible.

The simple example discussed above is an example of a more general problem that is encountered in a wide range of applications. In general, an input digital signal that consists of a sequence of "symbols" is transmitted through a "communication link" and is received as an output digital signal at the output of the communication link. The output digital signal also consists of a sequence of "symbols". Each of the symbols is chosen from a predetermined set of symbols, referred to as an alphabet. The output signal is assumed to be written in the same alphabet as the input signal.

In the simplest case, the signals are binary signals in which the alphabet consists of the symbols "0" and "1". In this case the input and output signals consist of a sequence of 0s and 1s. However, other alphabets are commonly used. For example, a digitized signal in which each symbol is represent by an integer between 0 and M−1 is commonly used in broadband data transmission systems for connecting users to the Internet via a digital subscriber loop (DSL).

While the above examples refer to communication systems, it should be noted that this type of noise problem is present in a number of data processing systems. For example, the storage of a data file on a magnetic disk drive can be viewed as the transmission of a digital signal through a communication link, the disk drive. The input signal is a sequence of symbols, e.g., bytes of data, which are chosen from a predetermined alphabet. In the case of byte data, each symbol has an integer value chosen from the set [0, 1, . . . , 255]. The retrieved file from the disk drive also consists of a sequence of symbols chosen from this set. The input signal symbols are processed by the electronics of the disk drive and stored in the form of localized magnetic fields that are read to generate the output signal. Noise in the digital to analog circuitry that converts the symbols to and from the magnetic fields introduces errors into the output signal. In addition, the magnetic fields can be altered during storage by random events that introduce additional errors.

Similarly, digital photography may be viewed as involving the transmission of a signal through a channel that corrupts the signal. In this case, the signal is the image which is corrupted by noise in the photodetectors.

BRIEF DESCRIPTION OF THE DRAWINGS

FIG. 1 is a block diagram of a denoising system 10, according to one embodiment of the present invention, operating on an output signal that has been corrupted by a channel.

FIG. 2 illustrates a portion of the output signal wherein a sequence of symbols $a_1, a_2, \ldots, a_k$ in which the $a_i$ is fixed is shown as appearing at a number of locations in the output signal.

FIG. 3 is a flow chart of the signal-processing algorithm used in the second pass according to one embodiment of the invention.

SUMMARY OF THE INVENTION

The present invention includes an apparatus and method for processing a received digital signal that has been corrupted by a channel to generate a processed digital signal having less signal corruption than the received digital signal. The apparatus includes first, second, and third memories and a controller. The first memory stores the received digital signal, which includes a sequence of symbols that has been corrupted by the channel. The second memory stores information specifying the probability that a symbol having a value I will be converted to a symbol having a value J by the channel. The third memory stores information specifying a signal degradation function that measures the signal degradation that occurs if a symbol having the value I is replaced by a symbol having a value J. The controller generates a processed digital signal from the received digital signal by replacing symbols in the received digital signal. The controller replaces each symbol having a value I in a context of that symbol in the received digital signal with a symbol having a value J if the replacement is estimated to reduce the overall signal degradation in the processed digital signal relative to the received digital signal as measured by the signal degradation function. The context includes a sequence of symbols having fixed values and in a predetermined location with respect to the symbol being considered for replacement. The controller utilizes the information in the second memory to estimate the number of occurrences of each symbol value in the underlying noise-free signal that were converted by the channel into a symbol having the same value and context in the received signal as the symbol being considered for replacement.

DETAILED DESCRIPTION OF THE PREFERRED EMBODIMENTS

The present invention provides a method for reducing the signal degradation resulting from the noise that is introduced into a digital signal when the signal is processed by a system that introduces noise errors. The processing system that introduces the noise will be referred to as the "channel" in the following discussion because such a system is analogous to a transmission channel over which the signal is sent. Refer now to FIG. 1, which is a block diagram of a denoising system 10 according to one embodiment of the present invention, operating on a signal that has been corrupted by a channel 20. The channel operates on an input signal 21 comprising a sequence of symbols from a known alphabet to generate an output signal 22 that also comprises a sequence of symbols from that alphabet.

The present invention benefits from knowing the manner in which the channel introduces noise. That is, the probability that a symbol, A, in the input signal will be converted to a symbol, B, in the output signal is known. In addition, the present invention is optimized for the case in which the channel does not have a memory. That is, the probability that a symbol A will be converted to the symbol B is independent of the symbols that preceded or follow A in the input signal, and of the manner in which the preceding or following symbols are converted. In general, the algorithm underlying the present invention will operate on data assuming that the above assumptions hold, but the operation of the algorithm is well defined regardless of the validity of the assumptions. The channel (conversion) probability information, in particular, can be viewed as a tunable set of parameters leading to a parametric class of algorithms some of which work better than others, depending on the actual characteristics of the data and noise. If the above assumptions hold, and the actual noise arises as a result of the assumed conversion probabilities, the algorithm has some appealing properties that can be expressed as theorems in a well defined mathematical sense. While this situation is desirable, it is not required for a practical application of the present invention.

The present invention also assumes that there is a quantified measure of the degradation introduced into the output signal by replacing a symbol having the value A in the input signal by a symbol having the value B in the output signal. The degradation may be different for different values of A and B. In the following discussion this degradation measure will be referred to simply as the "degradation" and denoted by $D(A,B)$.

Systems that utilize an alphabet that contains more than two symbols, $D(A,B)$ will often depend on the difference between A and B. For example, consider a digital signal that is generated by converting an analog time varying signal to a sequence of digital values utilizing an 8-bit analog-to-digital converter. The resulting digital signal is a sequence of symbols chosen from an alphabet having 256 symbols corresponding to the digital values 0 through 255. Assume that the output signal is to be converted back into an analog signal and played back to a human observer. The error in the output signal resulting from a symbol being altered by 1 is usually much less than the error resulting from a symbol being altered by a 2, and so on. Hence, the degradation function will depend on the amount by which the symbol is changed in this case.

The present invention attempts to identify symbols that have a high probability of having been changed by the channel. These symbols are then altered to produce a denoised output signal 23 in which the overall signal degradation introduced by the channel as measured by the degradation function is reduced. If the symbols in the output signal are considered one at a time, very little information can be obtained with respect to the probability that any particular symbol is in error if the symbols appear with approximately equal frequencies in the input signal. If one assumes that the various symbol values have equal frequencies in the input signal, the frequencies with which the symbols appear in the output signal will also be approximately equal in most cases of interest. Consider a binary signal that passes through a channel in which the probability of converting a 1 to a 0 is the same as the probability of converting a 0 to a 1. If there were approximately equal numbers of 1s and 0's in the input signal, the output signal will also have approximately equal numbers of 1s and 0s, since, for every 1 that is converted to a 0 there will also be a 0 that is converted to a 1. Hence, one cannot identify any particular symbol that is more likely to be the result of noise than any other symbol.

The present invention is based on the observation that improvements in the output signal can be made if one "symbol" value is very rare compared to another "symbol" value. For example, suppose that symbol A occurs very rarely in the input signal compared to symbol B, and that channel errors result in A being converted to B and B being converted to A. Also assume that the probability of A being converted to B is the same as that of B being converted to A; denote this probability by P. It is assumed that P is known. Denote the number of symbols in the input signal having the values of A and B by $N_A$ and $N_B$, respectively. Denote the number of symbols in the output signal having the values of A and B by $N'_A$ and $N'_B$, respectively. It should be noted that only $N'_A$ and $N'_B$ are available to the denoiser. The number of symbols having the value A in the output signal is equal to the number of symbols having the value A in the input signal less the number of symbols having the value A that were converted to another symbol plus the number of symbols having some other value that were converted to A. To simplify the discussion, consider the case in which A and B are the only two symbols in the alphabet. Then, $$N'_A \approx N_A - P^*N_A + P^*N_B$$

and $$N'_B \approx N_B - P^*N_B + P^*N_A,$$

where the error in the approximations after dividing/normalizing by the total number of counts is small with high probability, especially as the number of symbols becomes large. Throughout this document, when errors in approximations or estimates of unnormalized symbol counts are said to be "small" or quantities involving unnormalized symbol counts are said to be "close" to one another, it is to be understood that the relevant errors are small, not necessarily on an absolute scale, but are small relative to the total number of symbols, or, in other words, are small after dividing/normalizing by the total number of symbols in the signal.

To simplify the following discussion, it is assumed that the above approximations have zero error or that the equality holds. Thus, given P, $N'_A$, and $N'_B$, the above system of equations (with $\approx$ replaced by =) can be solved for $N_A$ and $N_B$ to yield estimates of the number of occurrences of A and B, respectively, in the input sequence. We shall denote these estimates of the counts of A and B respectively by $n_A$ and $n_B$. Note that their counterparts, $N_A$ and $N_B$, which denote the actual counts in the input sequence, are unavailable to the denoiser in the envisioned applications. In this example, we assume that $N_A << N_B$ and that $P << 1$; hence, $N'_A$ is approximately equal to $N_A + P^*N_B$ and $N'_B$ is approximately equal to $N_B$. In this case, it can be seen that the channel errors increase the frequency of the rare symbol. The $N'_A$ symbols in the output signal can be viewed as consisting of two class of symbols. The first class consists of symbols that were correctly transmitted by the channel, and the second class consists of symbols that were incorrectly transmitted in a manner that converted symbols of value B to symbols of value A.

If one could ascertain to which class each symbol having the value A belonged, the symbols that were in the second class could be converted back to B and the errors corrected. Unfortunately, there is no way of making this determination. The present invention examines two other possible actions, do nothing or convert all As back to Bs. The present invention performs the action that results in the least estimated signal degradation as measured by $D(A,B)$.

Consider a case in which the signal degradation associated with converting an A to a B is the same as that associated with converting a B to an A, i.e., D(A,B)=D(B, A)=D. The output signal has approximately $PN_B \approx N'_A - N_A$ errors resulting from the conversion of a B to an A by the channel. If nothing is done about these errors, a total signal degradation of $(N'_A - N_A)D$ will be present in the output signal. The estimated signal degradation is taken to be $Pn_B D$, which in this example is also well approximated by $N'_A - n_A$.

Suppose all of the symbols having value A in the output signal are set to B. This will correct the $N_A' - N_A$ errors resulting from changing B to A. This change will also introduce approximately $(1-P)N_A \approx N_A$ new errors into the output signal because the $N_A$ symbols that are correctly represented as As in the output signal are converted to Bs. Hence, the total signal degradation resulting from changing all As to Bs in the output signal is about $N_A*D$, which the present invention estimates to be $(1-P)n_A D$ (well approximated by $n_A D$ in this example). Note that if $(N'_A - N_A)D > N_A*D$, then setting all As in the output signal to Bs will reduce the overall signal degradation. Accordingly, if $N'_A > 2N_A$, all of the As should be converted to Bs in this example. As $N_A$ and $N_B$ are unknown in practice, the algorithm of the present invention applies an approximation of this decision rule obtained by replacing $(N'_A - N_A)$ and $N_A$ by the respective estimates $Pn_B$ ($\approx N'_A - n_A$) and $(1-P)n_A$ ($\approx n_A$).

This simple example assumes that the input and output signals are composed of symbols in which the symbol A was very rare compared to the symbol B. While the algorithm of the present invention can be applied to the case in which the symbols have approximately equal frequencies, the application of the algorithm in that case will almost always result in the symbols of the output signal being left unchanged.

The present invention is based on the observation that while the frequencies of the individual symbols in the output signal may have substantially equal numbers, there are often repeated short runs of symbols that can be used to construct "super symbols" that have very different frequencies. Consider a system in which the symbols of the input and output signals are chosen from an alphabet having M values. Referring to FIG. 2 which illustrates a portion of the output signal, wherein a sequence of symbols $a_1, a_2, \ldots, a_k$ in which the $a_i$ is fixed is shown as appearing at a number of locations 24 in the output signal. The sequence $a_1, a_2, \ldots, a_k, x$, where x is the next symbol after the sequence can be viewed as a "super symbol" that can take on M values that are determined by the value of x. If a sequence $a_1, a_2, \ldots, a_k$ can be found for which $a_1, a_2, \ldots, a_k, x$ occurs much less frequently than the sequence $a_1, a_2, \ldots, a_k, x'$ for some value of x and x', then a generalization of the algorithm used in the above discussion above can be applied to improve the overall signal degradation.

As noted above, the present invention alters symbols in the output signal if the total degradation introduced by the channel and the alteration after these symbols are altered is estimated to be less than the degradation imposed by the channel if nothing is done. Once again, denote the input signal to the channel by the sequence, $\{y_i\}$ and the output signal from the channel by the sequence, $\{z_i\}$. Here, i=1 to N. The goal of the present invention is to change the symbols in $\{z_i\}$ to obtain a new output signal $\{z'_i\}$ such that the total degradation resulting from the differences between $\{y_i\}$ and $\{z'_i\}$ is less than total degradation resulting from the differences between $\{y_i\}$ and $\{z_i\}$.

Consider a symbol in the output signal. A sequence of symbols having fixed values and in a predetermined location with respect to that symbol will be referred to as the "context" of that symbol. For example, the sequence $a_1, a_2, \ldots, a_k$ discussed above is a context of the symbol x if the sequence $a_1, a_2, \ldots, a_k, x$ appears in the output signal. It should be noted that the symbol x may appear in a large number of different contexts. In addition, a context may be a sequence that is in some other predetermined relationship to the symbol other than just the symbols to the left of the symbol in question. Such cases will be discussed in more detail below; however, to simplify the following discussion, it will be assumed for the moment that the context of the symbol $z_j$ in the output signal is the k symbols to the left of that symbol in the sequence of output symbols. It will also be assumed that k is fixed. The manner in which k is chosen will also be discussed in more detail below.

Consider a particular symbol $z_j$ in the output signal. The context of that symbol is the sequence $[z_{j-k} \ldots z_{j-2}, z_{j-1}]$. That is, $a_1 = z_{j-k}$, $a_2 = z_{j-k+1}$, and so on. To simplify the following discussion, the sequence of values $a_1, a_2, \ldots, a_k$ will be denoted by the vector a. The present invention counts the number of times the context a followed by the value x is found in the output signal for each value of x from 0 to M-1. From the observed counts, the number of occurrences of the context in the output signal followed by each possible x value in the original signal, $\{y_i\}$, can be estimated using the known error rates for the channel. Once these estimates are determined, a decision to reset all sequences of the form a,x to a,x' can be made based on the known degradation function in a manner analogous to that described above.

The manner in which the present invention operates can be more easily understood with reference to a simple exemplary system. Consider a transmission in which the output of the channel is a sequence of symbols having two states, i.e., a binary coded transmission. It will be assumed that the probability of the channel changing a bit from a 0 to a 1 is the same as the probability of changing the bit from a 1 to a 0. It will also be assumed that the signal degradation resulting from switching a 0 to a 1 is the same as that resulting from a 1 being switched to a 0, i.e., D(0,1)=D(1, 0)=D. A discussion of the more general cases in which an alphabet having more than two symbol values is used and in which more general degradation functions are used will be provided below. Suppose for the purposes of this example that it is known that a sequence $a_1, a_2, \ldots, a_k, 0$ is expected to occur rarely during the transmission compared to the sequence, $a_1, a_2, \ldots, a_k, 1$ for some choice of the bits $a_1, a_2, \ldots, a_k$. In terms of the above-described example, a,0 corresponds to the "super symbol" value A, and a,1 corresponds to the super symbol value B. A denoising system according to the present invention operates by resetting the final bit of all sequences $a_1, a_2, \ldots, a_k, 0$ from a 0 to 1 or vice versa, if the resulting signal is estimated to have less overall degradation, as measured by the degradation function, than the original signal received from the channel.

Assume that the algorithm of the present invention is being applied to the $j^{th}$ bit in the output signal, $\{z_i\}$. Denote the k bits preceding $z_j$ by the vector $a=[a_1, a_2, \ldots, a_k]$. The method of the present invention starts by counting the number of times the sequences a,0 and a,1 appear in the output signal. Denote these two counts by $N'_0$ and $N'_1$, respectively. For the purposes of this example, assume that $N'_0 << N'_1$. That is, the sequence a,0 occurs much less frequently than the sequence a,1 in the output signal. The sequence a,0 can arise in the output signal because the input signal contained that sequence. The sequence can also appear because the channel converted some instances of the sequence a,1 to a,0. Similarly, the sequence a,1 can arise in the output signal because the input signal contained this sequence, and the channel correctly conveyed the sequence. Alternatively, a,1 can arise because the channel erroneously converted the sequence a,0 to a,1.

To determine the costs associated with doing nothing and the cost associated with converting all instances of one sequence to the other, an estimate of the number of occurrences of a in the output sequence $\{z_i\}$ followed by 0 and 1 in the corresponding locations in the original sequence $\{y_i\}$ is needed. Denote the number of times the sequences a,0 and a,1 appear with a in the output sequence and 0 and 1 in the corresponding input sequence locations by $N_0$ and $N_1$, respectively. Specifically, $N_0$ counts the number of indices j such that $[z_{j-k}, z_{j-k-1}, \ldots, z_{j-1}]$=a and $y_j$=0, and $N_1$ counts the number of indices j such that $[z_{j-k}, z_{j-k-1}, \ldots, z_{j-1}]$=a and $y_j$=1. Note that $N_0$ and $N_1$ are not available to the denoising algorithm since they involve unobserved information about the uncorrupted input signal. Denote the probability that a bit is flipped from a 0 to 1 or a 1 to 0 by P. Then, $N_0$ and $N_1$ can be estimated by solving the system of equations:

$$N'_0 = n_0 - n_0 * P + n_1 * P \quad (a)$$

$$N'_1 = n_1 - n_1 * P + n_0 * P \quad (b)$$

for $n_0$ and $n_1$, where $N'_0$ and $N'_1$ are number of occurrences of a,0 and a,1 in the output sequence, respectively. We will denote the estimates of $N_0$ and $N_1$, as obtained by the present invention based on solving the above equations, by $n_0$ and $n_1$, respectively. The number of instances of the sequence a,0 in the output signal that are the result of errors introduced by the channel is with high probability close to $PN_1$, which the present invention estimates by $Pn_1$. Hence, the signal degradation that will be incurred if nothing is done is estimated to be $Pn_1D$. If all of the instances of a,0 are converted to a,1, then about $(1-P)N_0$ errors will be made, since $(1-P)N_0$ of these instances are expected to be correct. The present invention estimates this quantity by $(1-P)n_0$. Hence, the signal degradation resulting from setting all instances of a,0 to a,1 is estimated to be $(1-P)n_0D$. Accordingly, the present invention would reset all instances of a,0 to a,1 if $(1-P)n_0 < Pn_1$. For the case when $P<<1$ and $N_0<<N_1$, with high probability $(1-P)n_0$ will be close to $N_0$ and $Pn_1$ will be close to $N'_0 - N_0$. That is, denoising according to the present invention, for this range of P, $N_0$ and $N_1$, corresponds, with high probability, to the sensible rule of setting all instances of 0 occurring with context a to 1, if more than half of such occurrences of 0 are in error.

In the above example, it was assumed that $N_0<<N_1$. Assuming that the channel error rate, P, is small, it can be shown that the cost of resetting all of the a,1 sequences to a,0 will almost always be much greater than doing nothing, since most of these values will be correct. Hence, only the case of resetting a,0 to a,1 has been considered in detail. However, the algorithm discussed above can also be applied in this case. The result will merely be to leave the symbol unchanged.

The above example assumes that the degradation associated with mistakenly changing a 0 to 1 is the same as the cost associated with mistakenly changing a 1 to a 0. In some settings, this will not be the case. If D(0,1) is different from D(1,0) then the decision to reset the bits will depend on the relative values of D(0,1) and D(1,0). The degradation associated with doing nothing in the above example is then estimated to be $Pn_1D(1,0)$. The degradation associated with changing all instances of a,0 to a.1 is similarly estimated to be $(1-P)n_0D(0,1)$. In the present example, all instances of a,0 will be changed to a,1 if $(1-P)n_0D(0,1)<Pn_1D(1,0)$.

The above examples assume a value for k has been determined. The present invention provides the greatest benefits in those cases in which the input signal has contexts that are repeated a statistically significant number of times. That is, the sequence a is found enough times that a statistically accurate estimate of the number of occurrences of x in the input signal preceded by a in the output sequence can be made. The above-described analysis depends on estimating the fraction of the observed sequences that result from channel errors. This estimate is based on the observed frequencies of occurrences of each sequence in the sequence leaving the channel. The accuracy of this data is limited by the statistical accuracy of the frequencies of the observed sequences in the output sequence. If the number of observed occurrences of the sequences in the output sequence is small, the accuracy of equations (a) and (b) discussed above will be low, and hence, the accuracy of the estimates no and $n_1$ derived by solving these increasingly inaccurate equations will likewise be low. If the accuracy of these counts is sufficiently low, the wrong decision with respect to resetting the symbols in the output signal will be made.

Consider the case in which a symbol x having a context a of length k is to be processed as described above. Further assume that the sequence a, appears Q times where $Q>>1$, but the larger context p,a does not appear frequently for any value of p. Then a context that is larger than k will have much fewer occurrences, and the statistical accuracy of the counts will be degraded relative to the case in which the smaller context was used. Hence, choosing too large a value for k can result in decision errors.

The minimum value of k depends on the correlations in the input signal. If k is too small, the statistical accuracy of the estimates for a,x in the input signal will be high; however, the relative occurrences of a,x for each value of x will be more nearly equal. As noted above, the denoising method will not change the x value even if there are a significant number of x values that are the result of noise, since the relative frequencies of the various sequence values will be similar to one another. In this case, no improvement in the total degradation of the signal will be obtained by resetting all of one symbol to another symbol.

From the above discussion, it is clear that there is an optimum value of k. This optimum can be determined empirically. If the length of the correlated sequences in the input signal does not change markedly over time, an optimum value for k can be determined experimentally by utilizing exemplary input signals and comparing the results of denoising for various values of k.

In principle, k can be determined for any particular output signal by denoising the signal using a number of different k values. In such a system, the value of k can be decreased from some upper bound until a value that provides satisfactory statistical accuracy is found. In addition, the denoising algorithm can be repeated with different k values to uncover other symbols that should be reset.

Estimates of reasonable starting values for k can also be made if the statistics of the symbols in the input sequence are known. Such estimates will be discussed below in more detail.

The above-discussed examples involved a context consisting of a sequence of symbols to the left of the symbol being processed in the signal. However, other forms of context can be utilized. For example, a context consisting of a fixed sequence on each side of the symbol x can be utilized, i.e., a,x,b. Similarly, a context consisting of a fixed sequence on the right side of the symbol can be utilized, i.e., x,b. In addition, sequences in which the vectors a and/or b have "wild cards" can also be utilized. That is, a may be written in the form $a_1, a_2, \ldots, a_w, \ldots, a_k$, where $a_w$ can be a string of symbols in which the symbols in the string can take on any value. Similarly, the vectors do not need to be adjacent to the symbol being processed as long as the vectors are in a predetermined location relative to that symbol. It should be noted that a and b can be of different lengths and either a or b could be missing, i.e., length 0.

In the above exemplary embodiments, the symbols in the sequences were binary. However, the present invention can be applied to sequences in which the symbols have more than two values. In the general case, each symbol is chosen from an alphabet having M symbols. That is, $y_j$, $z_j$, $z'_j$, $a_j$, and $b_j$, can take on the values $0, 1, 2, \ldots, M-1$. In this case, the channel is characterized by a matrix $P(I,J)$ that provides the probability that a symbol having the value I will be converted to a symbol having the value J by the channel. Here, I and J each run from 0 to $M-1$. Similarly, it is assumed that there is a predetermined matrix $D(I,J)$ that measures the degradation inflicted on the signal if a symbol I is replaced by a symbol J.

The denoising strategy used in this more general case is analogous to that described above with reference to binary sequences. Given a symbol $z_j$ that is to be processed, determine a context for that symbol by examining the sequence of symbols that are in a predetermined relationship to the symbol in question. Denote the sequences of this context by a and b. Count the number of occurrences, $N'(x)$, of a,x,b in the output signal for each value of x from 0 to $M-1$. The probability matrix, P, is then used to estimate the number of occurrences $N(x)$ of a,x,b in the input signal for x from 0 to $M-1$ in a manner analogous to that described above. Let $n(x)$ denote these estimates which, as above, satisfy the system of equations (expressed in matrix notation)

$$N' = nP, \qquad (c)$$

where $N'$ and n are M-dimensional row vectors with components consisting, respectively, of the counts $N'(x)$ and $n(x)$, for $x=0$ and $M-1$, and P is the channel probability matrix defined above. Therefore, we express $n(x)$ as $$n = N'P^{-1}, \qquad (d)$$

where $P^{-1}$ is the matrix inverse of P. Using $D(I,J)$, compute the estimated total signal degradation that would occur if all instances of a,q,b are replaced by a,x,b for each possible value of x, where $q=z_j$. The case in which $x=q$ corresponds to the case in which the sequences are left unchanged. Replace $z_j$ by p where p is the value of x for which the estimated total signal degradation is minimized.

If all instances of a,q,b are left unchanged, the signal degradation will be the sum of the contributions from each possible value of a,x,b that was converted to a,q,b erroneously by the channel. The contribution from a,x,b is the number of errors times the degradation arising from each error. The number of erroneous a,q,b arising from a,x,b is, with high probability, close to $N(x)P(x,q)$ which is estimated to be $n(x)P(x,q)$. The degradation arising from each error is $D(x,q)$. Hence, the estimated degradation of the signal if nothing is done is the sum of $n(x)P(x,q)D(x,q)$ over all x values different from q. Consider the degradation that occurs if all instances of a,q,b are converted to a,p,b. Some of the instances of a,q,b are the result of the channel converting instances of p with output signal context a,b to q. Hence, the conversion of all instances of a,q,b to a,p,b will correct these. The remaining instances of a,q,b that are converted to a,p,b will be errors. Hence, the total degradation resulting from converting a,q,b to a,p,b is estimated as the sum of $n(x)P(x,q)D(x,p)$ over all x values that are different from p, where, again $n(x)P(x,q)$ is an estimate of $N(x)P(x,q)$, which, in turn, is expected to be close, with high probability, to the number of occurrences of q having context a,b that were originally x in the input signal. The value of p that minimizes the estimated degradation is selected to replace q. The minimizing value could very well be q, which would amount to leaving a,q,b unchanged.

Refer again to FIG. 1. In one preferred embodiment of the invention, a two-pass system is used to denoise the signal, $\{z_i\}$. For the purposes of this example, it will be assumed that the context of each symbol is the k symbols to the left of that symbol and the k' symbols to the right of that symbol. In the first pass, controller 11 stores the received $\{z_i\}$ in a memory 13 as the symbols are received. Controller 11 also makes a list of all sequences of length $K=k+k'+1$ in $\{z_i\}$. These sequences and the number of times each sequence was encountered are stored in a context memory 14. It should be noted that the received signal does not need to be stored in a high-speed memory. At any given time, K symbols from the received signal are needed by controller 11 during the first pass. Hence, the received signal can be stored on a disk drive. Only the context memory 14 needs to be a high-speed memory. In addition, controller 11 may also store the identity and counts for each sequence having a length less than K.

Apparatus 10 also includes a memory 12 for storing data specifying the probability that the channel will convert a symbol I into a symbol J. This information is preferably stored both as a matrix P and the inverse of matrix P, since the inverse matrix is needed to estimate the number of occurrences of x in the original sequence that are converted by the channel into symbols having the context a, b in the corrupted sequence.

Memory 12 also stores information specifying the signal degradation that occurs when a symbol I is converted into a symbol J by channel 20. In the preferred embodiment of the invention, this information is stored in the form of a matrix whose $I^{th}$, $J^{th}$ element is the degradation that occurs when a symbol I is replaced by a symbol J.

Refer now to FIG. 3, which is a flow chart of the signal processing algorithm used in the second pass. After the received signal has been stored in memory 13, controller 11 sequentially examines the received symbols to determine if a symbol should be reset to another value. When controller 11 is at $z_j$, controller 11 reads the k symbols on left of $z_j$ and the k' symbols to right of $z_j$ to determine the largest context for $z_j$ for which counts have been stored in memory 14 as shown at 51. Controller 11 extracts the counts associated with this context from memory 14 as shown at 52 and determines if the stored counts will lead, via the above estimation procedure, to estimates of the various input symbol counts having sufficient statistical accuracy to proceed as shown at 53. If the counts have sufficient accuracy, controller 11 estimates the number of occurrences of each symbol value in the original signal having the present context in the corrupted signal, as shown at 54. The signal degradation that would occur if $z_j$ is replaced by each possible symbol value is then estimated as shown at 55. Denote the value of x for which the estimated signal degradation is minimized by $x_{min}$. The case in which $x=z_j$ corresponds to the case in which $z_j$ is unchanged. The $j^{th}$ output symbol, $z'_j$ is then set to $x_{min}$ as shown at 56. The value of j is then incremented as shown at 57 and controller 11 proceeds to processing the next symbol in the same manner.

If the statistical accuracy of the counts in 52 is not sufficient, controller 11 checks to see if data for a smaller context is also present as shown at 58. For example, if the current context involves the k symbols to the right and the k' symbols to the left of $z_j$, a context in which the (k−1) symbols to the right and the k' symbols to the left can be tested. If memory 14 includes counts for strings of length K−1, the necessary data is present. If a smaller context is found, controller 11 picks a context of this length that has not yet been examined as shown at 60 and repeats the process described above starting from step 52. If data for a smaller context is not available, $z'_j$ is' set to $z_j$, and controller 11 proceeds to the next symbol as shown at 59.

The algorithm of the present invention uses the channel probability matrix P to compute the estimates of input symbol counts (equations (c) and (d)), and also to compute estimated degradations when deciding how to denoise a symbol. The matrix P can be viewed as a tunable parameter of the algorithm, and a good choice for P can be obtained in any number of ways. One option is to derive P interactively by adjusting it until the resulting denoised signal is judged to be of sufficient quality. Alternatively, the choice of P can be based on prior knowledge of the channel. In some cases it may be possible to estimate P directly from the corrupted signal itself, based on the distributions of symbols occurring in certain contexts that strongly hint at the true value of the corresponding symbol in the input signal. For example, when the input data consists of binary images and the channel is a binary channel, the fraction of 1's occurring in an all-0 context is likely to be a good estimate of the channel conversion probability P(0,1), since in almost all instances the corresponding input symbol will be 0. A generalization of this technique to larger alphabet signals would amount to searching for regions of the output signal that have minimal variation, and then making the assumption that the input signal in these regions is nearly constant. For a given such region, let I be an estimate of this constant input value, which could be derived in a variety of ways (median, mean, etc.). Then the empirical distribution of the output signal restricted to the region corresponding to I, would be a reasonable estimate of P(I,J) for J=0, ..., M−1, which is the I-th row of P. Finally, combinations of the above techniques (e.g. estimation+prior knowledge+interactive experimentation) may lead to the best results.

It is also worth mentioning that the degradation matrix D(I,J) can also be viewed as a tunable parameter of the algorithm, the best choice of which can also be determined interactively, through experimentation. Usually, however, a denoising problem will have a natural and widely accepted measure of degradation, which can be reflected in a suitable D matrix.

The embodiments of the present invention discussed above have utilized separate memories for storing the received digital signal, probability function, channel degradation function, and sequence counts. However, embodiments in which a single memory is utilized for storing two or more of these items can also be constructed without departing from the teachings of the present invention.

The above-described embodiments of the present invention have utilized a denoising apparatus that directly processes the received signal and has specific memories for use in storing the various parameters, contexts, channel matrix, and degradation functions. However, the present invention can be practiced on a general-purpose data processing system to which a copy of the received signal from the channel has been transferred by loading an appropriate data processing program into that data processing system.

Various modifications to the present invention will become apparent to those skilled in the art from the foregoing description and accompanying drawing. Accordingly, the present invention is to be limited solely by the scope of the following claims.

What is claimed is:

1. An apparatus comprising:

first, second, and third memories for storing, respectively, a received signal comprising a sequence of symbols generated from a noise-free signal by a channel that introduces noise, information specifying the probability that a symbol having a value I was converted to a symbol having a value J by said channel, and information specifying a signal degradation function that measures signal degradation resulting from a symbol having the value I being replaced by symbol having a value J;

a controller that generates a processed signal from said received signal by replacing symbols in said received signal, wherein said controller replaces each symbol having a value I in a context of that symbol in said received signal with a symbol having a value J if said replacement is estimated to reduce the overall signal degradation in said processed signal relative to said noise-free signal as measured by said signal degradation function, said context comprising a sequence of symbols having fixed values and in a predetermined location with respect to said symbol being replaced.

2. The apparatus of claim 1 further comprising a fourth memory for storing a first list having the identity and number of occurrences of each sequence of a first length within said received signal.

3. The apparatus of claim 2 wherein said fourth memory also stores a second list having the identity and number of occurrences of each sequence of a second length within said received signal, wherein said second length is less than said first length.

4. The apparatus of claim 3 wherein said context is chosen from one of said first and second lists, said choice depending on said number of occurrences for sequences in said first list and said second list.

5. The apparatus of claim 1 wherein said controller utilizes said information in said second memory to estimate the number of occurrences of each symbol value in said noise-free signal that was converted by the channel to a symbol having said value I and having said context in said received signal.

6. The apparatus of claim 5 wherein said controller estimates degradation with respect to said noise-free signal when setting all values of symbols with said context to J and selects that J which minimizes the estimated degradation.

7. A method for processing a received signal comprising a sequence of symbols that has been generated from a noise-free signal by a channel to generate a processed signal, said method comprising:

storing said received signal;

storing channel corruption information specifying the probability that a symbol having a value I will be converted to a symbol having a value J by said channel;

storing information specifying a signal degradation function that measures the signal degradation that occurs if a symbol having the value I is replaced by symbol having a value J; and generating said processed signal by replacing each symbol having a value I in a context of that symbol in said received signal with a symbol having a value J if said replacement is estimated to reduce the overall signal degradation in said processed signal relative to said noise-free signal as measured by said signal degradation function, said context comprising a sequence of symbols having fixed values and in a predetermined location with respect to said symbol being replaced.

8. The method of claim 7 further comprises storing a first list having the identity and number of occurrences of each sequence of a first length within said received signal.

9. The method of claim 8 further comprises storing a second list having the identity and number of occurrences of each sequence of a second length within said received signal, wherein said second length is less than said first length.

10. The method of claim 9 wherein said context is chosen from one of said first and second lists, said choice depending on said number of occurrences for sequences in said first list and said second list.

11. The method of claim 7 wherein said channel corruption information is used to estimate the number of occurrences of each symbol value in said noise-free signal that was converted by the channel to a symbol having said value I and having said context in said received signal.

12. The method of claim 11 wherein said degradation is estimated with respect to said noise-free signal by setting all values of symbols with said context to J and selects that J which minimizes the estimated degradation.

13. A computer readable medium encoded with a data processing program for processing a received signal comprising a sequence of symbols that has been corrupted by a channel to generate a processed signal, said data processing program causing a data procession system
   to store said received signal;
   to store channel corruption information specifying the probability that a symbol having a value I will be converted to a symbol having a value J by said channel;
   to store information specifying a signal degradation function that measures the signal degradation that occurs if a symbol having the value I is replaced by symbol having a value J; and
   to generate said processed signal by replacing each symbol having a value I in a context of that symbol in said received signal with a symbol having a value J if said replacement is estimated to reduce the overall signal degradation in said processed signal relative to said received signal as measured by said signal degradation function, said context comprising a sequence of symbols having fixed values and in a predetermined location with respect to said symbol being replaced.

14. The computer readable medium of claim 13 wherein said data processing program further causes said data processing system to store a first list having the identity and number of occurrences of each sequence of a first length within said received signal.

15. The computer readable medium of claim 14 wherein said data processing program further causes said data processing system to store a second list having the identity and number of occurrences of each sequence of a second length within said received signal, wherein said second length is less than said first length.

16. The computer readable medium of claim 15 wherein said context is chosen from one of said first and second lists, said choice depending on said number of occurrences for sequences in said first list and said second list.

17. The computer readable medium of claim 13 wherein said channel corruption information is used to estimate the number of occurrences of each symbol value in said noise-free signal that was converted by the channel to a symbol having said value I and having said context in said received signal.

* * * * *

UNITED STATES PATENT AND TRADEMARK OFFICE
CERTIFICATE OF CORRECTION

PATENT NO.         : 7,047,472 B2                                    Page 1 of 1
APPLICATION NO. : 10/688520
DATED              : May 16, 2006
INVENTOR(S)        : Itschak Weissman et al.

It is certified that error appears in the above-identified patent and that said Letters Patent is hereby corrected as shown below:

In column 8, line 19, delete "no" and insert -- $n_0$ --, therefor.

In column 10, line 66, delete "z;" and insert -- $z_j$ --, therefor.

Signed and Sealed this

Sixth Day of October, 2009

David J. Kappos
*Director of the United States Patent and Trademark Office*